US007326972B2

(12) United States Patent
Ghoneima et al.

(10) Patent No.: US 7,326,972 B2
(45) Date of Patent: Feb. 5, 2008

(54) INTERCONNECT STRUCTURE IN INTEGRATED CIRCUITS

(75) Inventors: Maged M. Ghoneima, Evanston, IL (US); Muhammad M. Khellah, Tigard, OR (US); James W. Tschanz, Portland, OR (US); Yibin Ye, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/880,988

(22) Filed: Jun. 30, 2004

(65) Prior Publication Data

US 2006/0001103 A1    Jan. 5, 2006

(51) Int. Cl.
*H01L 27/10* (2006.01)
(52) U.S. Cl. ............... 257/208; 257/368; 257/E21.11; 257/E21.618; 326/68
(58) Field of Classification Search ............. 326/68; 257/368, 208, E27.11, E21.618, E29.162
See application file for complete search history.

(56) References Cited

U.S. PATENT DOCUMENTS

| 6,377,508 B1 * | 4/2002 | Tomishima et al. .... 365/230.06 |
| 6,407,574 B1 * | 6/2002 | Wen et al. .................. 326/21 |
| 6,653,890 B2 * | 11/2003 | Ono et al. .................. 327/537 |
| 6,864,539 B2 * | 3/2005 | Ishibashi et al. ........... 257/368 |
| 7,002,371 B2 * | 2/2006 | Kase et al. .................. 326/68 |
| 2005/0280437 A1 * | 12/2005 | Lewis et al. ................ 326/38 |

OTHER PUBLICATIONS

"International Technology for Semiconductor Roadmap", http://public.itrs.net/Files/2001ITRS/Links/1999_SIA_Roadmap/, Semiconductor Industry Association,(1999).
Hirose, K , et al., "A bus delay reduction technique considering crosstalk", *Proceedings—Design, Automation and Test in Europe Conference and Exhibition*, (Mar. 27-30, 2000),441-445.
Khellah, M M., et al., "Static pulsed bus for on-chip interconnects", *Symposium on VLSI Circuits Digest of Technical Papers*, (Jun. 13-15, 2002),78-79.
Kim, Ki-Wook , et al., "Coupling delay optimization by temporal decorrelation using dual threshold voltage technique", *IEEE Transactions on Very Large Scale Integration (VLSI) Systems*, 11(5), (Oct. 2003),879-887.
Kumar, Rajesh , et al., "Interconnect and noise immunity design for the Pentium 4 processor", *Intel Technology Journal, Q1*, (2001),1-12.
Miyazaki, M , et al., "A 1000-MIPS/W microprocessor using speed adaptive threshold-voltage CMOS with forward bias", *2000 IEEE International Digest of Technical Papers. ISSCC, Solid-State Circuits Conference*, (Feb. 7-9, 2000),420-421, 475.

(Continued)

*Primary Examiner*—Wai-Sing Louie
*Assistant Examiner*—John C Ingham
(74) *Attorney, Agent, or Firm*—Schwegman, Lundberg & Woessner, P.A.

(57) ABSTRACT

A device includes an interconnect structure having a number of circuit paths to transfer signals. The circuit paths transfer the signals at different speed to reduce the coupling capacitance effect between adjacent circuit paths.

25 Claims, 15 Drawing Sheets

OTHER PUBLICATIONS

Shin, Youngsoo, et al., "Coupling-driven bus design for low-power application-specific systems", *Proceedings—Design Automation Conference*, (Jun. 18-22, 2001),750-753.

Sotiriadis, P P., et al., "Bus energy minimization by transition pattern coding (TPC) in deep sub-micron technologies", *IEEE/ACM International Conference Computer Aided Design, 2000. ICCAD-2000*, (2000),322-327.

Stan, M , "Bus-invert coding for low-power I/O", *IEEE Transactions on Very Large Scale Integration (VLSI) Systems*, 3(1), (Mar. 1995),49-58.

\* cited by examiner

US 7,326,972 B2

INTERCONNECT STRUCTURE IN INTEGRATED CIRCUITS

FIELD

Embodiments of the present invention relate to bus lines in integrated circuits.

BACKGROUND

Integrated circuit devices such as processors, memory controllers, and graphics controllers reside in many computers and electronic systems. These devices often have internal connections such as buses to transfer signals.

The internal buses usually have multiple bus lines running parallel to each other. In most cases, the speed of the device depends in part on the speed of the bus. The parallel lines of the bus have a coupling capacitance. At some dimension, the coupling capacitance may decrease the speed of the bus.

To reduce the coupling capacitance effect, some buses have additional delay elements inserted in alternate bus lines.

However, the additional delay elements in the bus lines may reduce the available time for the signals to propagate through the bus, consume more power, waste space, or any combination of these factors.

DESCRIPTION OF EMBODIMENTS

Figure 1:
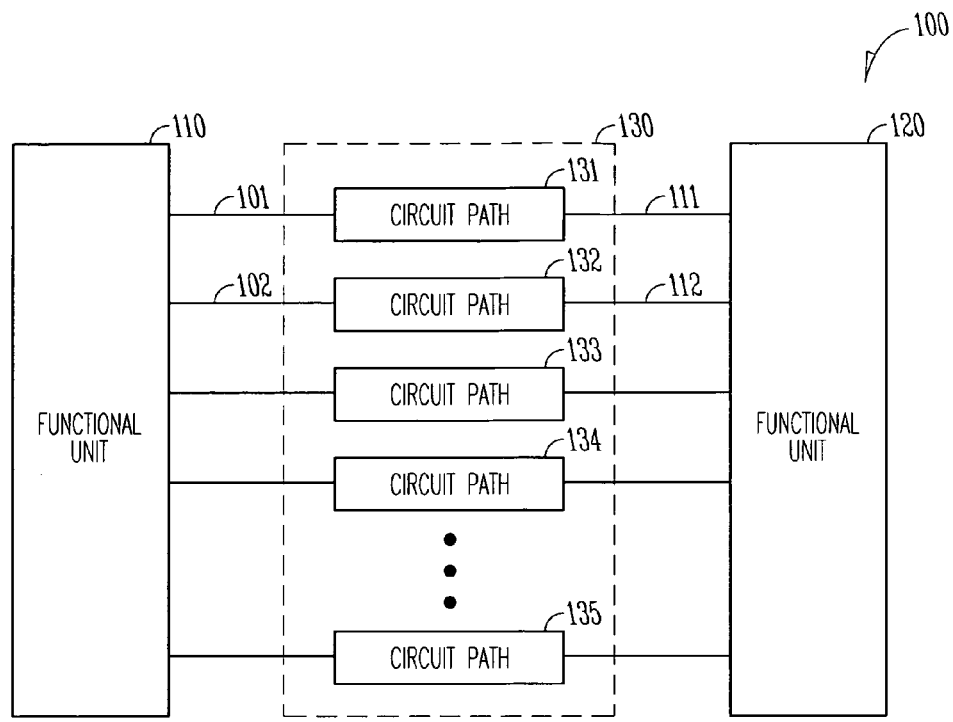
FIG. 1 shows a device having an interconnect structure according to embodiments of the invention.

The following description and the drawings illustrate specific embodiments of the invention sufficiently to enable those skilled in the art to practice the embodiments of the invention. Other embodiments may incorporate structural, logical, electrical, process, and other changes. In the drawings, like features or like numerals describe substantially similar components throughout the several views. Examples merely typify possible variations. Portions and features of some embodiments may be included in or substituted for those of others. The scope of the invention encompasses the claims and all available equivalents.

FIG. 1 shows a device having an interconnect structure. Device 100 includes functional units 110 and 120 and an interconnect structure 130. Each of the functional units 110 and 120 may include a number of circuit elements. For example, functional unit 110 may include transmitters or drivers; functional unit 120 may include receivers. Interconnect structure 130 serves as a bus to transfer signals (data) between functional units 110 and 120. In some embodiments, interconnect structure 130 is an on-chip bus in which functional units 110 and 120 and interconnect structure 130 are fabricated on the same semiconductor die or chip.

Device 100 may be a processing unit of any type of architecture, such as embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. Device 100 may also be a memory device, a memory controller, a graphic and memory controller, or other types of integrated circuits.

Interconnect structure 130 includes a number of circuit paths 131-135 (131, 132, 133, 134, and 135). Each of the paths 131-135 connects to functional units 110 and 120 at different nodes. For example, circuit path 131 connects to functional units 110 and 120 at nodes 101 and 111. As another example, circuit path 132 connects to functional units 110 and 120 at nodes 102 and 112.

The combination of circuit path 131-135 forms a bus. Each of the circuit paths 131-135 may include a number of circuit elements to transfer data between functional units 110 and 120. For example, each of the circuit paths may include inverters, flip flops, or both. A number of adjacent circuit paths exits in interconnect structure 130. For example, circuit paths 131 and 132 are adjacent circuit paths. As another example, circuit paths 132 and 133 are adjacent circuit paths.

In some embodiments, among circuit paths 131-135, the adjacent circuit paths have different structures. For example, circuit paths 131 and 132 may have different structures. As another example, circuit paths 132 and 133 may have different structures. Embodiments exist in which each of the circuit paths 131-135 has an equal number of circuit elements.

The different structures of the adjacent circuit paths allows interconnect structure 130 to reduce the coupling capacitance effect among circuit paths 131-135 in some situations. For example, a situation exists where functional unit 110 transfers a number of signals to functional unit 120 via interconnect structure 130 in which a signal at node 101 and a signal at node 102 may simultaneously switch in opposite directions. Signals switching opposite directions occurs when a signal (e.g., the signal at node 101) switches from a low signal level (low) to a high signal level (high) and the adjacent signal (e.g., the signal at node 102) switches from high to low. In the example above, switching the signals in opposite directions of the signals at nodes 101 and 102 may increase the coupling capacitance effect between adjacent circuit paths 131 and 132, thereby limiting the speed of the transfer of the signals between functional units 110 and 120. Interconnect structure 130 is constructed to reduce the coupling capacitance effect when signals switching in opposite directions are applied to adjacent circuit paths of interconnect structure 130.

In some embodiments, interconnect structure 130 is constructed such that during a signal transferring between functional units 110 and 120, the adjacent circuit paths skew the switching time of the signals that switch in opposite directions. In some embodiments, interconnect structure 130 gradually increases the delay between the signals that switch in opposite directions to prevent the signals from switching simultaneously. The coupling capacitance effect of adjacent circuit paths is reduced when one signal switches while the signal on the adjacent circuit path is quiet.

In the example above circuit paths 131 and 132 gradually increase the delay between the signal propagating from node 101 to node 111 and the signal propagating from node 102 to node 112. Thus, the signals on circuit paths 131 and 132 may not simultaneously switch in opposite directions.

Figure 2:
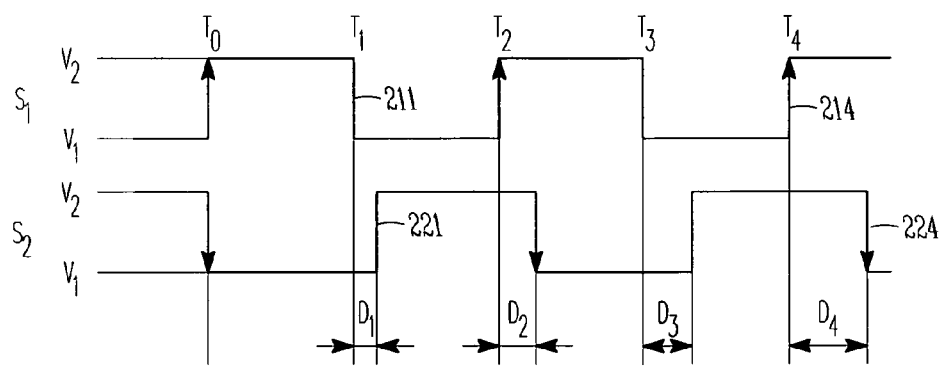
FIG. 2 is an exemplary timing diagram for FIG. 1.

FIG. 2 shows an exemplary timing diagram for FIG. 1. In FIG. 2, signals S1 and S2 represent two signals on adjacent circuit paths of FIG. 1. For example, the S1 signal may represent the signal sent to node 101 of circuit path 131 from functional unit 110 and the S2 signal may represent the signal sent to node 102 of circuit path 132 from functional unit 110. In FIG. 2, T1 through T4 represent reference times. FIG. 2 shows that the S1 and S2 signals simultaneously switch in opposite directions at time T0. At time T0, the S1 signal switches from V1 to V2 (low to high) while the S2 signal switches from V2 to V1 (high to low). In this example, switching the signals in opposite directions may increase the coupling capacitance effect between adjacent circuit paths. However, interconnect structure 130 of FIG. 1 reduces the coupling capacitance effect in this example by gradually separating the switching events of the oppositely switching of the signals on adjacent circuit paths.

In FIG. 2, each of the D1 through D4 indicates a time delay or propagation delay between the edges of the S1 and S2 signals relative to a reference time. For example, D1 indicates a delay between falling edge 211 and rising edge 221 relative to time T1. As another example, D4 indicates a delay between rising edge 214 and falling edge 224 relative to time T4.

The exemplary timing diagram of FIG. 2 shows that interconnect circuit 130 of FIG. 1 gradually increases the delay (skew) between the signals that simultaneously switch in the opposite directions to reduce the coupling capacitance effect.

Figure 3:
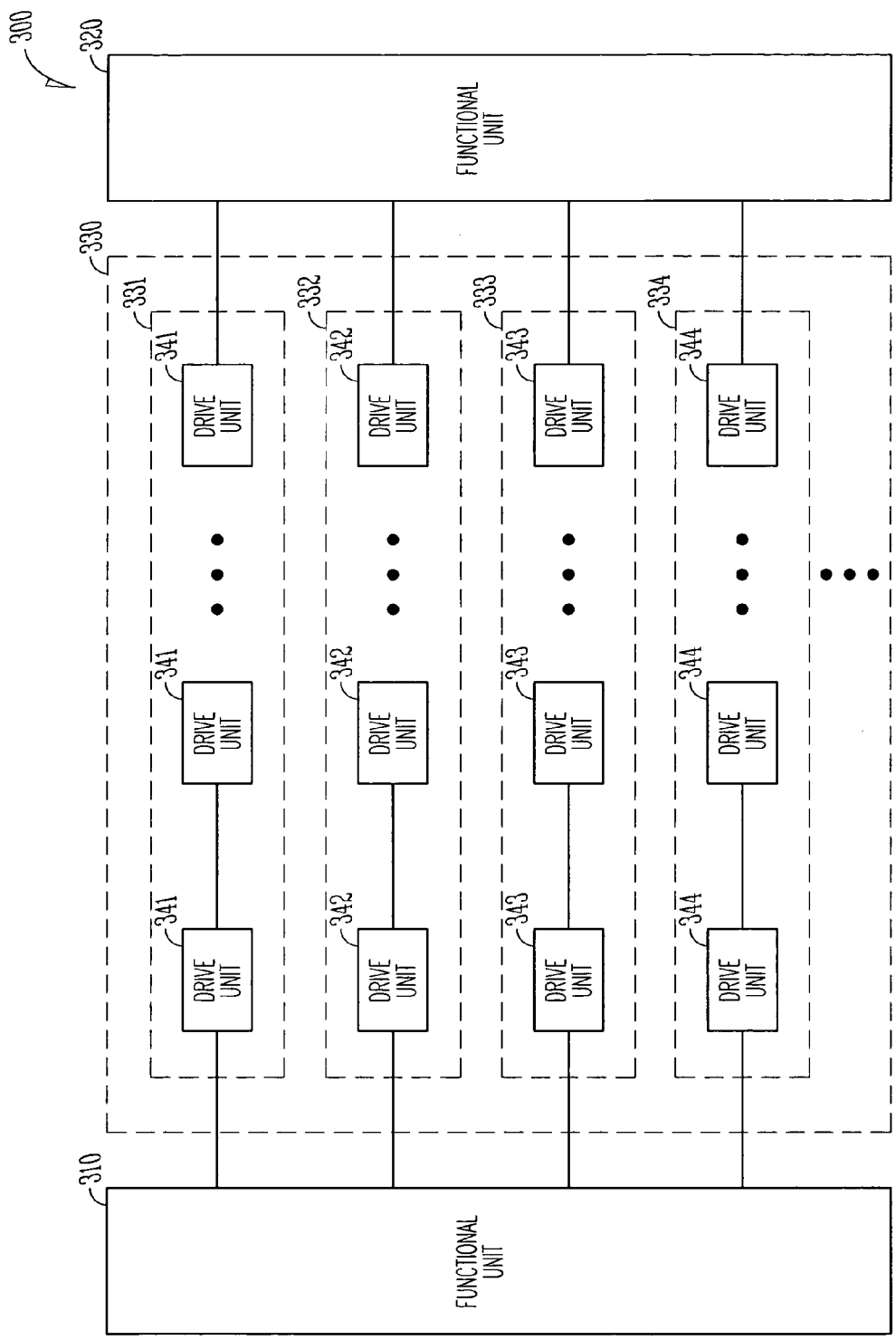
FIG. 3 shows a device having an interconnect structure with drive units according to embodiments of the invention.

FIG. 3 shows a device having an interconnect structure with drive units according to embodiments of the invention. Device 300 includes functional units 310 and 320, and an interconnect structure 330. Interconnect structure 330 includes a number of circuit paths 331-334 (331, 332, 333, and 334). Circuit path 331 has a number of drive units 341. Circuit paths 332, 333, and 334 have drive units 342, 343, and 344, respectively. In some embodiments, the drive units of one circuit path have different or unmatched (not identical) constructions from the drive units of an adjacent circuit path. For example, in some embodiments, the constructions of drive units 341 and drive units 342 are unmatched. In some embodiments, two adjacent circuit paths have different propagation delays to allow interconnect structure 330 to reduce coupling capacitance effect when opposite switching signals are sent to the adjacent circuit paths. Although two adjacent circuit paths have different propagation delays in some embodiments, each of the circuit paths 331-334 has an equal number drive units or equal number of circuit elements.

The circuit paths of FIG. 3 may be divided into different groups. For example, circuit paths 331 and 333 may be in a first group or first plurality of circuit paths; circuit paths 332 and 334 may be in a second group or a second plurality of circuit paths. As shown in FIG. 3, circuit paths 331 and 333 (first group) are physically interleaved with circuit paths 332 and 334 (second group) such that the circuit paths in the first and second groups are arranged in alternating adjacent positions.

FIG. 3 shows an interconnect structure 300 having four circuit paths and three drive units in each of the circuit paths, as an example. In some embodiments, the number of circuit paths may be different from four and the number of drive unit may be different from three.

Figure 4:
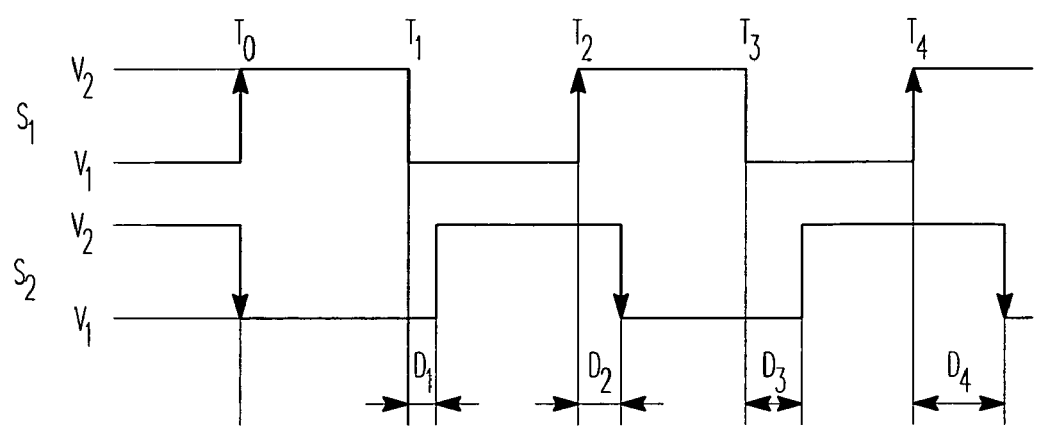
FIG. 4 is an exemplary timing diagram for FIG. 3.

FIG. 4 shows an exemplary timing diagram for FIG. 3. In FIG. 4, signal S1 and S2 represent two signals on adjacent circuit paths of FIG. 3 such as circuit paths 331 and 332. In FIG. 4, each of the D1 through D4 represents a delay (time delay). T1 through T4 represent reference times. Each of the reference times may represent the time at which a drive unit of FIG. 3 outputs a signal.

In FIG. 4, the S1 and S2 signals simultaneously switch in opposite directions at time T0. Time T0 may represent the time at which the S1 and S2 signals are simultaneously sent to the adjacent circuit paths of interconnect structure 330 of FIG. 3. At time T0 in FIG. 4, the S1 signal switches from V1 to V2 (low to high) while the S2 signal switches from V2 to V1 (high to low). In this example, switching of the signals in opposite directions may increase the coupling capacitance effect on the two adjacent circuit paths over which the S1 and S2 signals propagate. However, interconnect structure 330 of FIG. 3 reduces the coupling capacitance effect in this case by gradually increasing the delay between the S1 and S2 signals. The coupling capacitance effect is reduced when the oppositely switching signals on adjacent circuit paths do not switch simultaneously.

Figure 5:
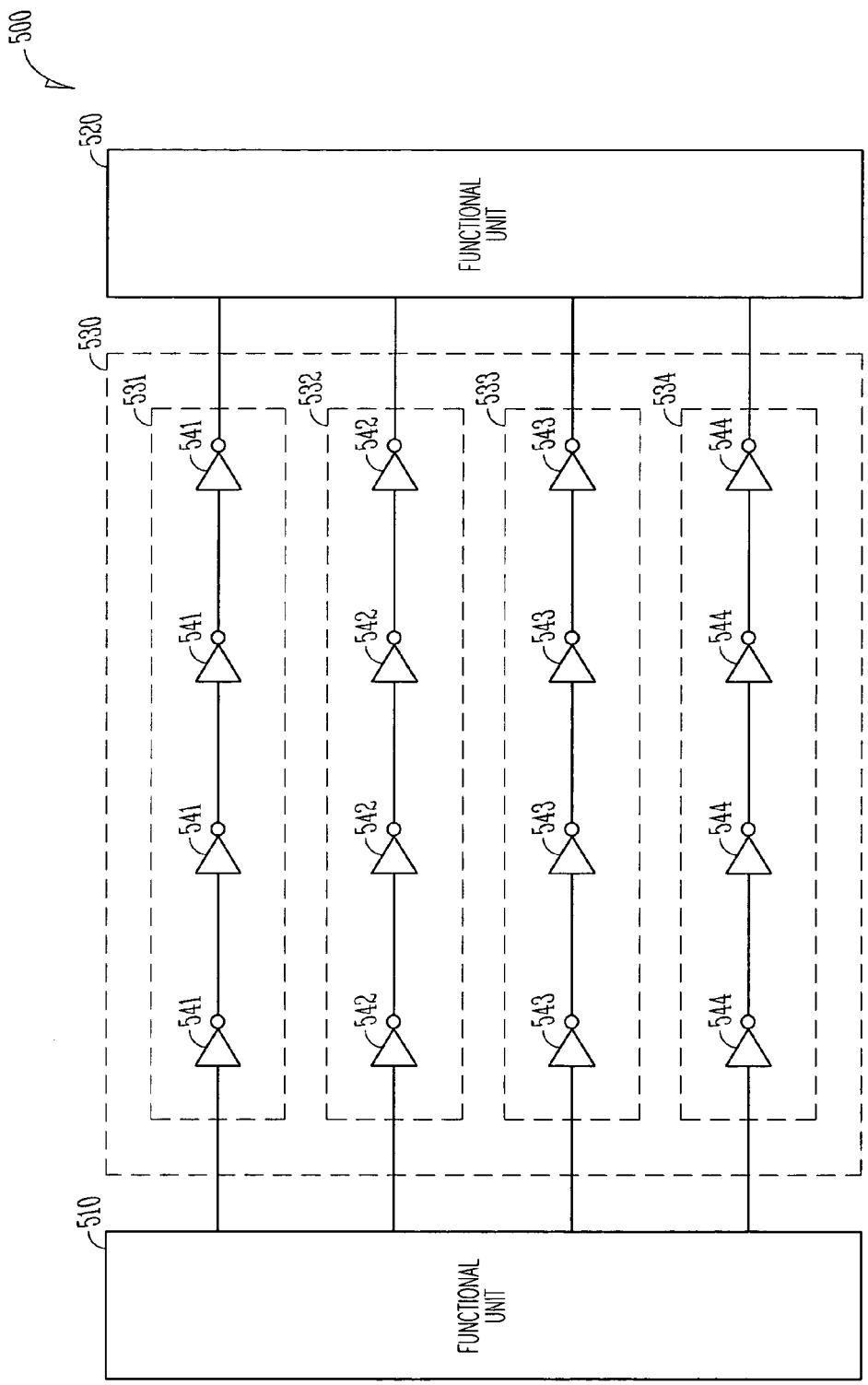
FIG. 5 shows a device having an interconnect structure with inverters according to embodiments of the invention.

FIG. 5 shows a device having an interconnect structure with inverters according to embodiments of the invention. Device 500 includes functional units 510 and 520, and an interconnect structure 530. In FIG. 5, interconnect structure 500 includes a number of circuit paths 511-534 (531, 532, 533, and 534). Circuit path 531 has a number of inverters 541. Circuit paths 532, 533, and 534 have inverters 542, 543, and 544, respectively. In some embodiments, the inverters of one circuit path may have a different configuration from inverters of an adjacent circuit path. For example, inverters 541 may have different switching times from inverters 542.

In some embodiments, two adjacent circuit paths have different configurations to allow interconnect structure 530 to reduce the coupling capacitance effect when two signals are simultaneously switched and are sent to adjacent circuit paths of interconnect structure 530.

FIG. 5 shows an interconnect structure 530 having four circuit paths and four inverters in each of the circuit paths, as an example. In some embodiments, the number of circuit paths may be different from four and the number of inverters may be different from four.

Figure 6:
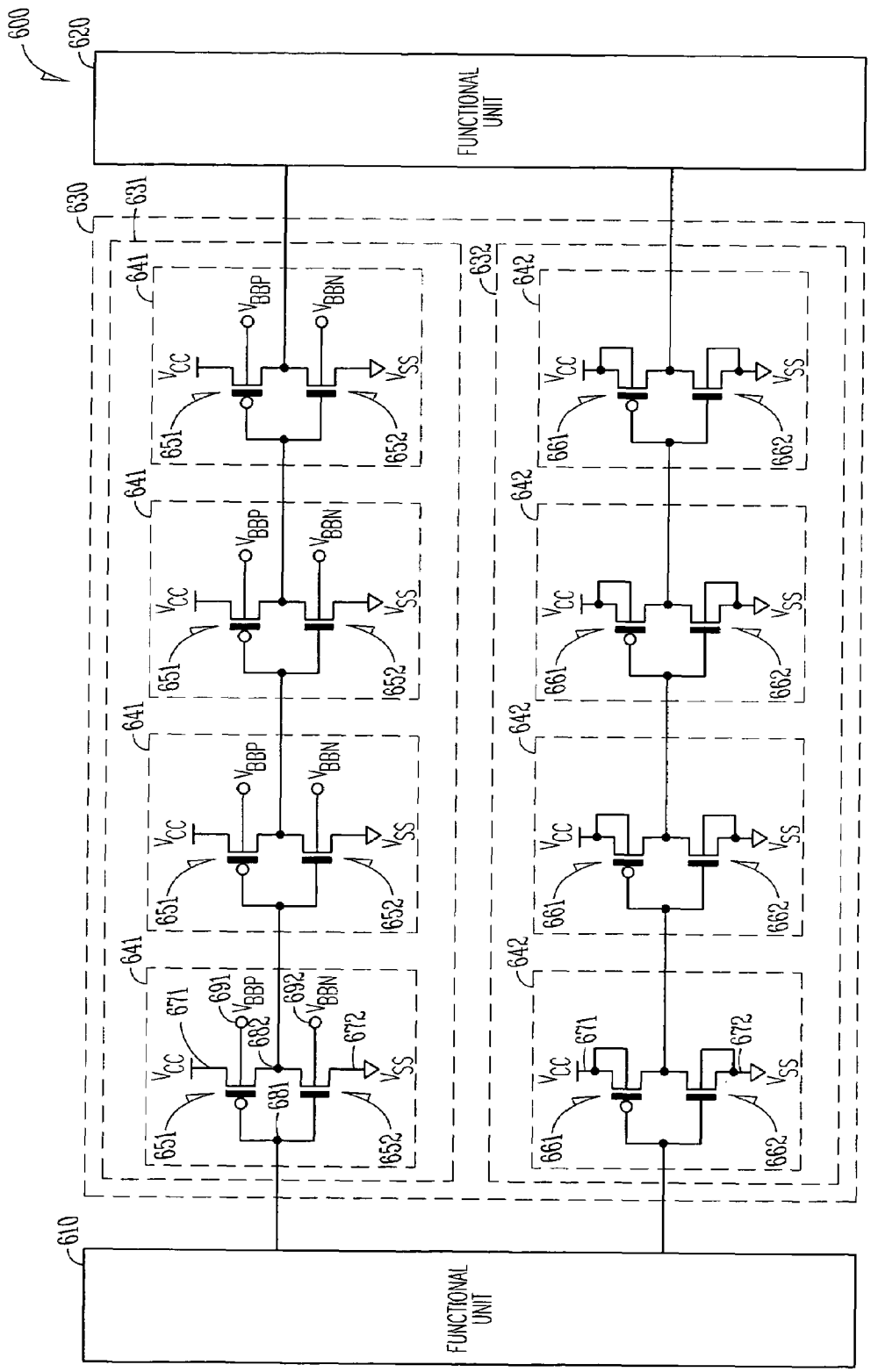
FIG. 6 shows a device with an interconnect structure having body bias transistors according to embodiments of the invention.

FIG. 6 shows a device 600 having two circuit paths and four drive units in each circuit path, as an example. In some embodiments, the number of circuit paths may be different from two and the number of drive units may be different from four.

Each of the drive units 641 includes transistors 651 and 652 forming an inverter. Transistors 651 and 652 have a common gate or an input node 681 and a common drain 692 or an output node 682. Transistor 651 has a source (source region) connected to a supply node 671 and a body connected to a bias node 691. Transistor 652 has a source connected to a supply node 672 and a body connected to a bias node 692. In FIG. 6, supply node 671 connects to a supply voltage Vcc and supply node 672 connects to Vss. In some embodiments, Vcc is a supply voltage of device 600 and Vss is ground.

Bias node 691 connects to a bias voltage $V_{BBP}$. Bias node 692 connects to a bias voltage $V_{BBN}$. In some embodiments, $V_{BBN}$ is greater than Vss and less than the forward junction bias voltage between the body of transistor 652 at node 692 and the source of transistor 652 at node 672. In some embodiments, $V_{BBP}$ is less than Vcc and is greater than the forward junction bias voltage between the body of transistor 651 at node 691 and the drain of transistor 651 at node 671. These bias voltages, $V_{BBN}$ and $V_{BBP}$, change the effective threshold voltages of the drive units, and hence changes their switching speeds.

For clarity, FIG. 6 shows complete reference numbers for the connections of only transistors of one drive unit of circuit path 631. Transistors of all drive units 641 of FIG. 6 have connections similar to that of the transistors with the complete reference numbers.

In circuit path 632, each of the drive units 642 includes transistors 661 and 662. The body of each of transistors 661 and 662 does not connect to a bias node. The body of each of the transistors 661 connects to supply node 671 to receive the supply Vcc. The body of each of the transistors 662 connects to supply node 672 to receive the supply voltage Vss.

As shown in FIG. 6, circuit paths 631 and 632 have different constructions. For example, in circuit path 631, the body of each of the transistors 651 and 652 connects to a bias node, whereas in circuit path 632, the body of each of the transistors 661 or 662 connects to a supply node.

The difference in construction between drive units 641 and 642 creates different propagation delays between circuit paths 631 and 632. The difference in the propagation delays between may reduce the coupling capacitance effect when two signals switching in opposite directions are provided to circuit paths 631 and 632 for transfer between functional units 610 and 620.

FIG. 6 shows a device 600 having two circuit paths and four drive units in each circuit path, as an example. In some embodiments, the number of circuit paths may be different from four and the number of drive units may be different from four.

Figure 7:
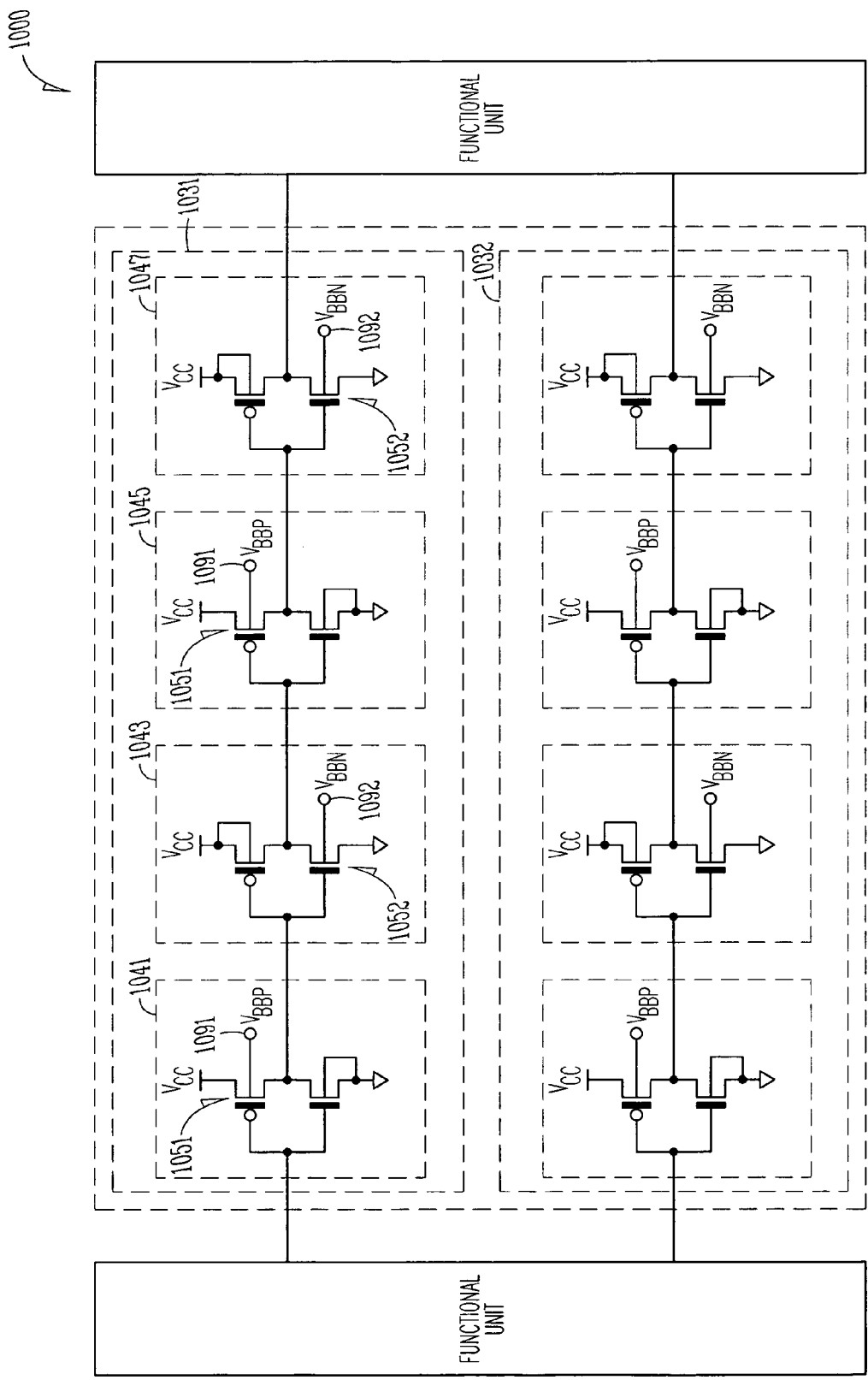
FIG. 7 shows a device with an interconnect structure having body bias transistors in both adjacent circuit paths according to embodiments of the invention.

FIG. 7 shows a device with an interconnect structure having body bias transistors in both adjacent circuit paths according to embodiments of the invention. In all circuit paths of device 1000, the drive units having transistors connected to a first bias node interleave with the drive units having transistors connected to a second bias node. For example, in a circuit path 1031, the body of each of the transistors 1051 of drive units 1041 and 1045 connects to a bias node 1091 to receive the bias voltage $V_{BBP}$. Also in circuit path 1031, the body of each of the transistors 1052 of drive units 1043 and 1047 connects to a bias node 1091 to receive the bias voltage $V_{BBN}$. The body of each of the other transistors connects to a supply node to receive either Vcc or Vss. Circuit path 1032 has a construction similar to that of circuit path 1031 such that both circuit paths 1031 and 1032 have matched drive units. Matched drive units are drive unit have the same (identical) construction.

FIG. 7 shows two circuit paths and four drive units in each of the circuit paths, as an example. In some embodiments, the number of circuit paths in each device may be different from two and the number of the drive units in each circuit path may be different from four.

Figure 8:
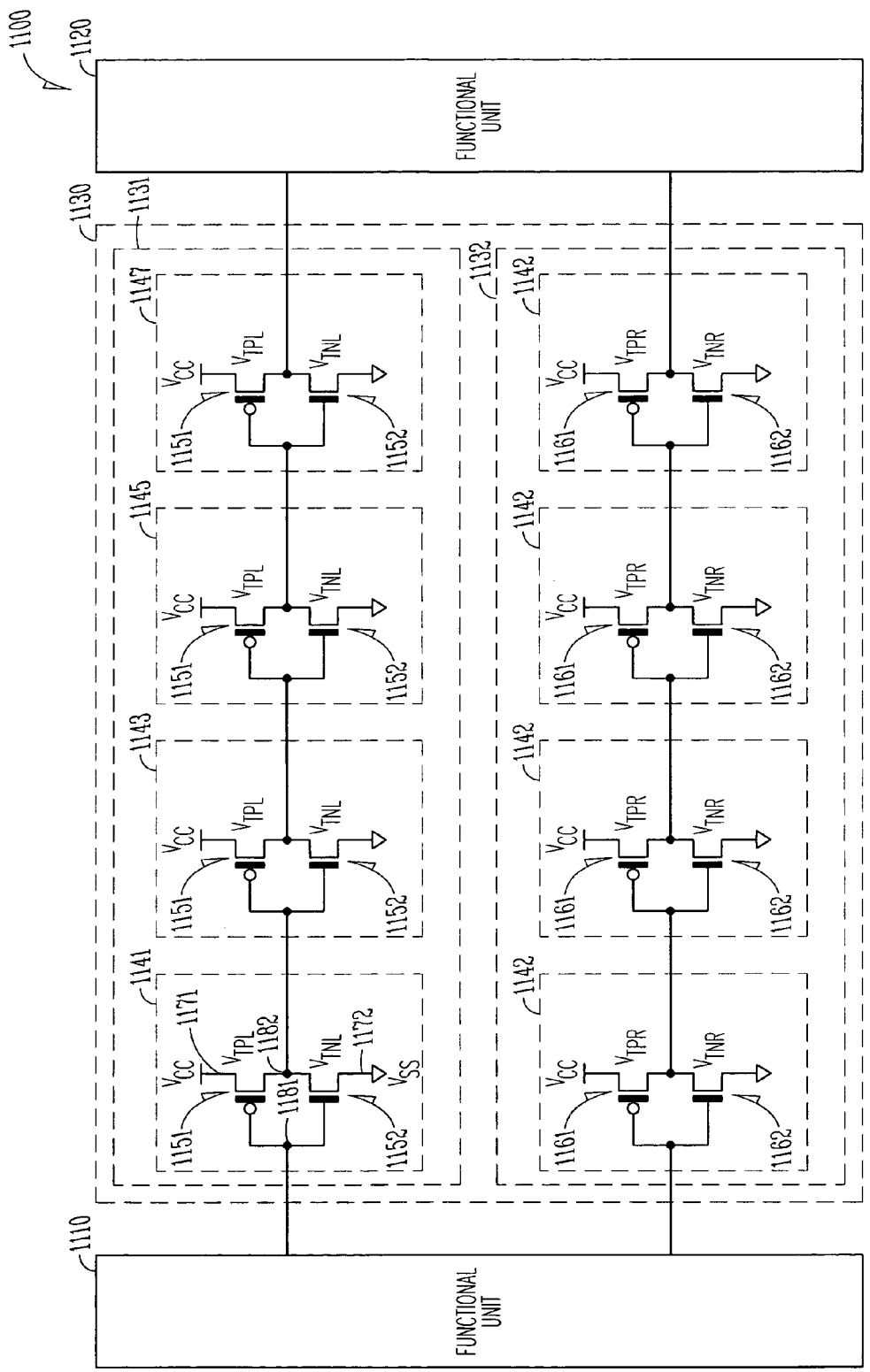
FIG. 8 shows a device with an interconnect structure having transistors with various threshold voltages according to embodiments of the invention.

FIG. 8 shows a device with an interconnect structure having transistors with various threshold voltages according to embodiments of the invention. Device 1100 includes functional units 1110 and 1120, and an interconnect structure 1130. Interconnect structure 1130 includes circuit paths 1131 and 1132. Circuit path 1131 has drive units 1141, 1143, 1145, and 1147. Circuit path 1141 has drive units 1142.

Each of the drive units 1141, 1143, 1145, and 1147 includes transistors 1151 and 1152 forming an inverter. Each of the drive units 1142 includes transistors 1161 and 1162 forming an inverter. In some embodiments, all of the transistors in FIG. 8 have an equal transistor size. In some embodiments, the transistor size is defined by the channel width, channel length, or the ratio of the channel width and channel length of the transistor.

Transistors 1151 and 1152 have a common gate or an input node 1181 and a common drain 1192 or an output node 1182. Transistor 1151 has a source connected to a supply node 1171. Transistor 1152 has a source connected to a supply node 1172. Supply node 1171 connects to a supply voltage Vcc and supply node 1172 connects to Vss. In some embodiments, Vcc is a supply voltage of device 1100 and Vss is ground.

Each of the transistors in FIG. 8 has a threshold voltage. The threshold voltage of a transistor is the gate voltage at which the transistor turns on. In FIG. 8, $V_{TPL}$, $V_{TPR}$, $V_{TNL}$, and $V_{TNR}$ indicate the threshold voltages of the transistors.

For example, in drive unit 1141, transistor 1151 has a threshold voltage $V_{TPL}$, and transistor 1152 has a threshold voltage $V_{TNL}$. In circuit path 1132, transistors 1161 and 1162 have threshold voltages of $V_{TPR}$ and $V_{TNR}$, respectively. Each threshold voltage of each transistor in FIG. 8 has a value.

In some embodiments, the relationship among the values of the threshold voltages in FIG. 8 may be represented by expression (1) below.

$$V_{TNR} \geq V_{TNL} \text{ and } V_{TPR} \geq V_{TPL} \qquad \text{expression (1)}$$

The difference in the threshold voltages among the transistors allows the transistors to have different switching times and the drive units to operate at different speeds, thereby creating different propagation delays between circuit paths 1131 and 1132. The difference in propagation delays may reduce the coupling capacitance effect when two opposite switching signals are provided to circuit paths 1131 and 1132 for transfer between functional units 1110 and 1120.

FIG. 8 shows a device 1100 having two cicuit paths and four drive units in each circuit path, as an example. In some embodiments, the number of circuit paths may be diiferent from two and the number of drive units may be different from four.

Figure 9:
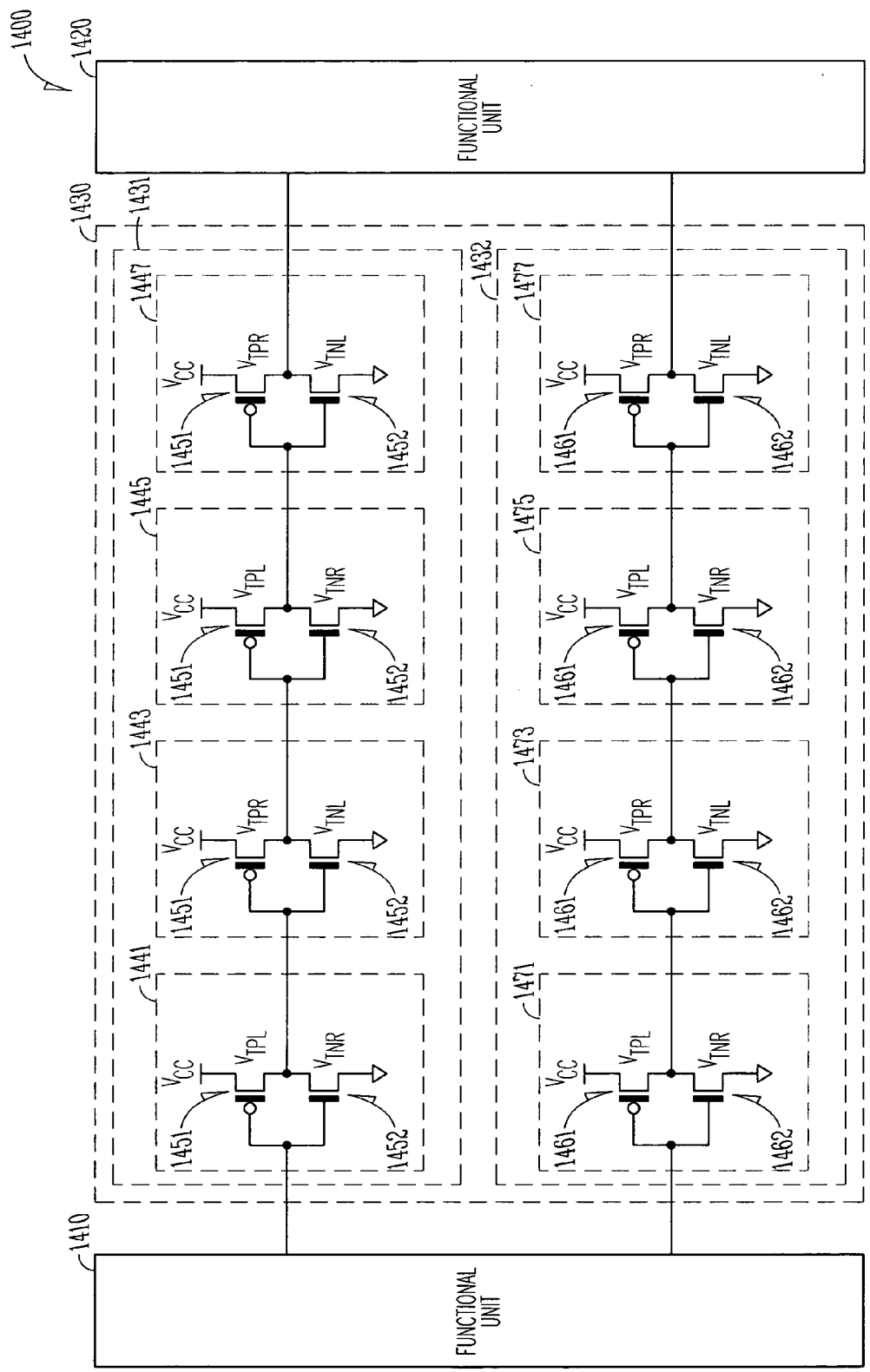
FIG. 9 shows another device with an interconnect structure having transistors with various threshold voltages in according to embodiments of the invention.

FIG. 9 shows another device with an interconnect structure having transistors with various threshold voltages in according to embodiments of the invention. Device 1400 includes functional units 1410 and 1420, and an interconnect structure 1430. Interconnect structure 1430 includes circuit paths 1431 and 1432. Circuit path 1431 has drive units 1441, 1443, 1445, and 1447. Circuit path 1441 has drive units 1471, 1473, 1475, and 1477. Each of the drive units 1441, 1443, 1445, and 1447 includes transistors 1451 and 1452 forming an inverter. Each of the drive units 1471, 1473, 1475, and 1477 includes transistors 1461 and 1462 forming an inverter. Each transistor in FIG. 9 has a threshold voltage.

Circuit path 1431 and 1432 have similar constructions. For example, in drive unit 1441, transistor 1451 and 1452 have threshold voltages $V_{TPL}$ and $V_{TNR}$, respectively; in drive unit 1471, transistors 1461 and 1462 also have threshold voltages $V_{TPL}$ and $V_{TNR}$, respectively. As another example, in drive unit 1443, transistor 1451 and 1452 have threshold voltages $V_{TPR}$ and $V_{TNL}$, respectively; in drive unit 1473, transistors 1461 and 1462 also have threshold voltages $V_{TPR}$ and $V_{TNL}$, respectively.

In some embodiments, the relationships among the values of the threshold voltages in FIG. 9 may be represented by expression (1).

FIG. 9 shows two circuit paths and four drive units in each of the circuit paths, as an example. In some embodiments, the number of circuit paths in each device may be different from two and the number of the drive units in each circuit path may be different from four.

Figure 10:
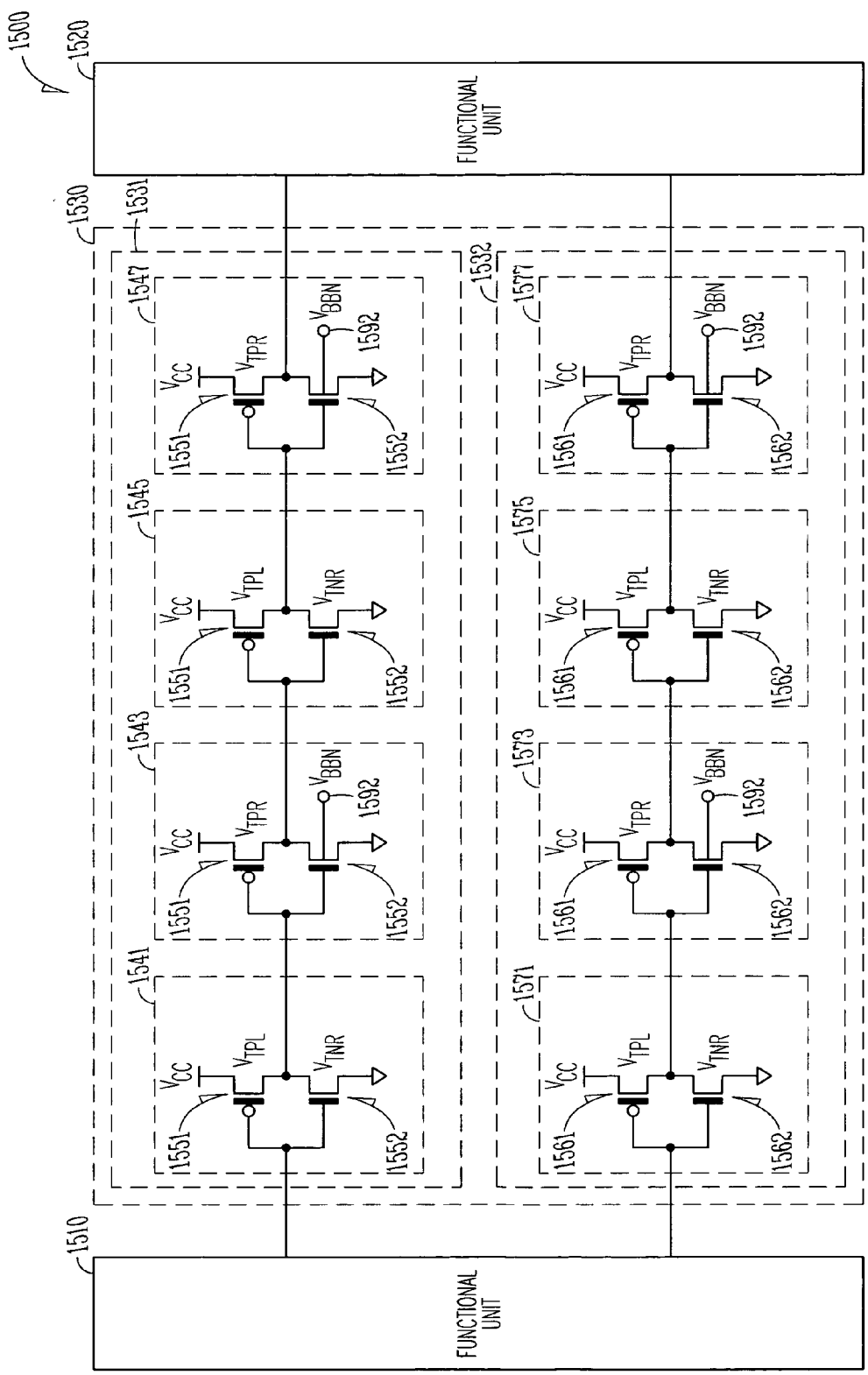
FIG. 10 and FIG. 11 show devices with interconnect structures having transistors with combinations of body bias connections and threshold voltages according to embodiments of the invention.
Figure 11:
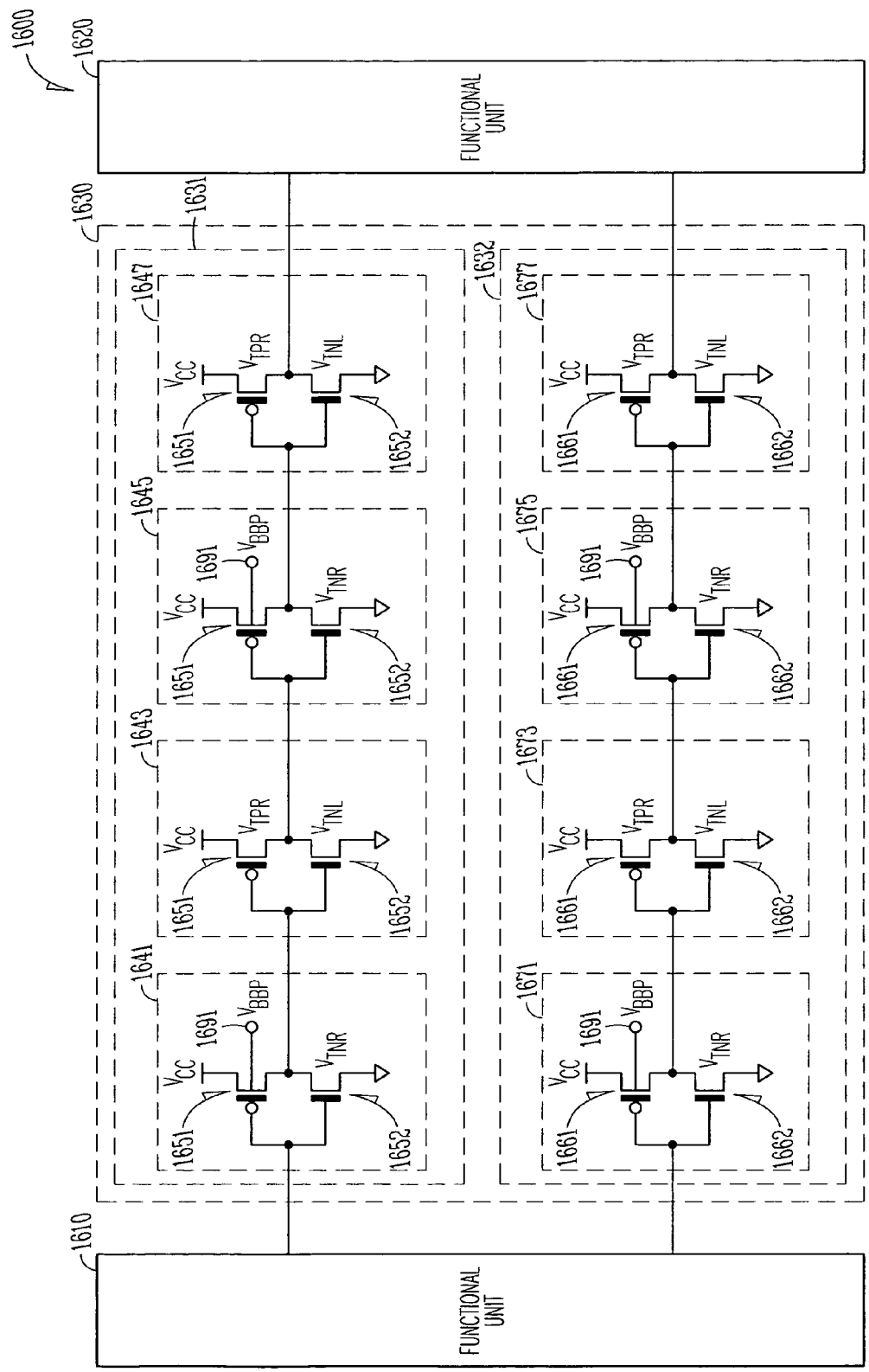

FIG. 10 and FIG. 11 show devices with interconnect structures having transistors with combinations of body bias connections and threshold voltages according to embodiments of the invention.

In FIG. 10, device 1500 includes functional units 1510 and 1520, and an interconnect structure 1530. Interconnect structure 1530 includes circuit paths 1531 and 1532. Circuit path 1531 has drive units 1541, 1543, 1545, and 1547. Circuit path 1541 has drive units 1571, 1573, 1575, and 1577. Each of the drive units 1541, 1543, 1545, and 1547 includes transistors 1551 and 1552 forming an inverter. Each of the drive units 1571, 1573, 1575, and 1577 includes transistors 1561 and 1562 forming an inverter.

Circuit path 1531 and 1532 have similar constructions. For example, in drive unit 1541, transistor 1551 and 1552 have threshold voltages $V_{TPL}$ and $V_{TNR}$, respectively; in drive unit 1571, transistors 1561 and 1562 also have threshold voltages $V_{TPL}$ and $V_{TNR}$, respectively. As another example, in drive unit 1543, transistor 1551 has a threshold voltage $V_{TPR}$, transistor 1552 has a body connected to a bias node 1592 to receive the bias voltage $V_{BBN}$; in drive unit 1573, transistor 1561 has a threshold voltage $V_{TPR}$ transistor 1562 has a body connected to bias node 1592 to receive the bias voltage $V_{BBN}$.

In some embodiments, the relationships among the values of the threshold voltages in FIG. 10 may be represented by expression (1).

The combination of threshold voltages and body bias connections in circuit paths 1531 and 1532 allows the transistors to have different switching time and the drive units to operate at different speeds, thereby creating different propagation delays between circuit paths 1531 and 1532. The difference in propagation delays may reduce the coupling capacitance effect when two opposite switching signals are provided to circuit paths 1531 and 1532 for transfer between functional units 1510 and 1520.

In FIG. 11, device 1600 includes functional units 1610 and 1620, and an interconnect structure 1630. Interconnect structure 1630 includes circuit paths 1631 and 1632. Circuit path 1631 has drive units 1641, 1643, 1645, and 1647. Circuit path 1641 has drive units 1671, 1673, 1675, and 1677. Each of the drive units 1641, 1643, 1645, and 1647 includes transistors 1651 and 1652 forming an inverter. Each of the drive units 1671, 1673, 1675, and 1677 includes transistors 1661 and 1662 forming an inverter.

Circuit path 1631 and 1632 have similar constructions. For example, in drive unit 1641, transistor 1651 has a body connected to a bias node 1691 to receive the bias voltage $V_{BBP}$, transistor 1652 has a threshold voltage $V_{TNR}$; in drive unit 1671, transistor 1661 has a body connected to a bias node 1691 to receive the bias voltage $V_{BBP}$, transistor 1662 has a threshold voltage $V_{TNR}$. As another example, in drive unit 1643, transistor 1651 and 1652 have threshold voltages $V_{TPR}$ and $V_{TNL}$, respectively; in drive unit 1671, transistors 1661 and 1662 also have threshold voltages $V_{TPR}$ and $V_{TNL}$, respectively.

In some embodiments, the relationships among the values of the threshold voltages in FIG. 11 may be represented by expression (1).

The combination of threshold voltages and body bias connections in circuit paths 1631 and 1632 allows the transistors to have different switching time and the drive units to operate at different speeds, thereby creating different propagation delays between circuit paths 1631 and 1632. The difference in propagation delays may reduce the coupling capacitance effect when two opposite switching signals are provided to circuit paths 1631 and 1632 for transfer between functional units 1610 and 1620.

Each of the devices in FIG. 10 and FIG. 11 shows two circuit paths and four drive units in each of the circuit paths, as an example. In some embodiments, the number of circuit paths in each device may be different from two and the number of the drive units in each circuit path may be different from four.

Figure 12:
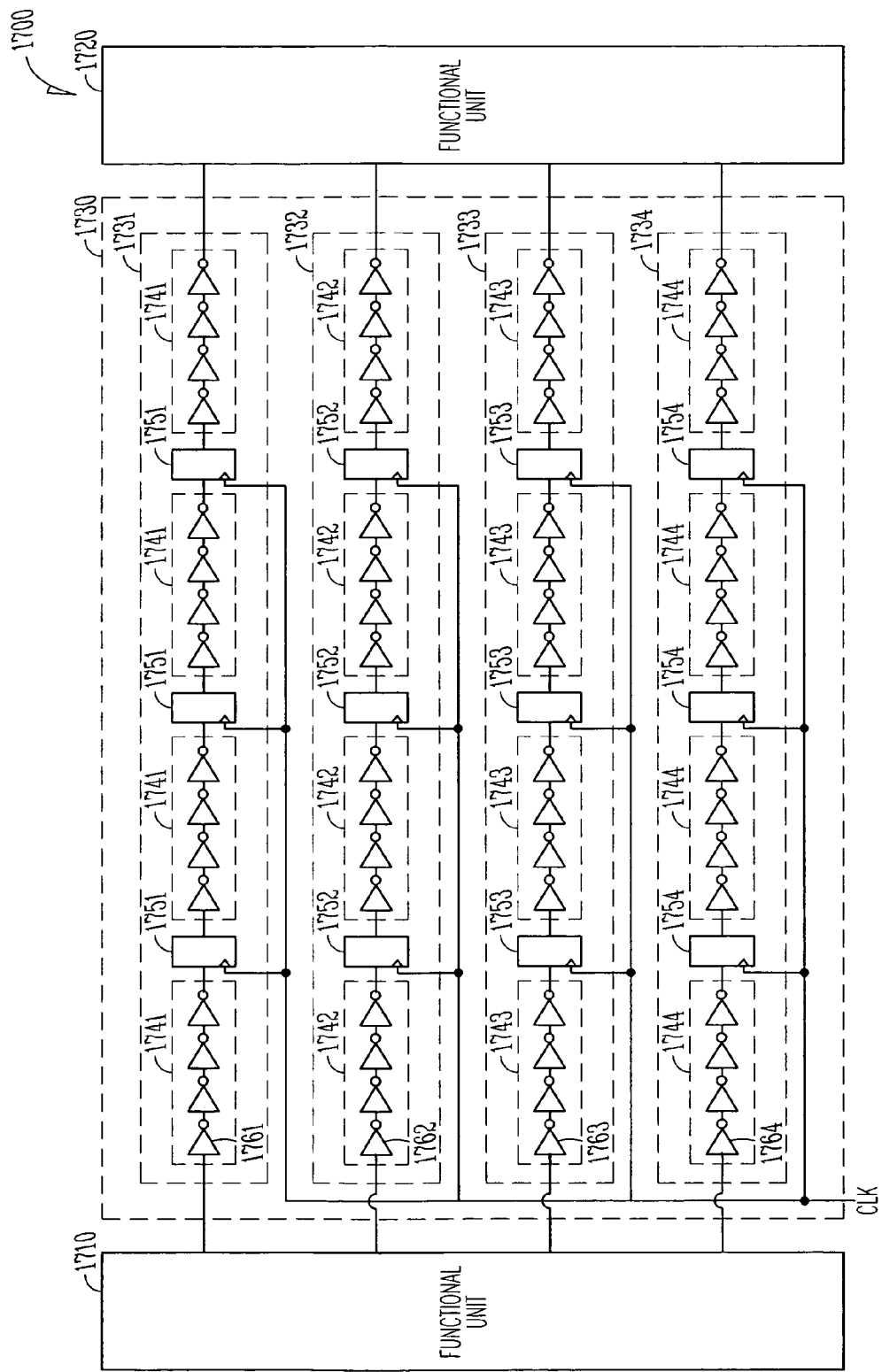
FIG. 12 shows a device with an interconnect structure having latches.

FIG. 12 shows a device with an interconnect structure having latches. Device 1700 includes functional units 1710 and 1720, and an interconnect structure 1730. Interconnect structure 1700 includes a number of circuit paths 1731-1734 (1731, 1732, 1733, and 1734). Each of the circuit paths 1731-1734 includes a number of sub-circuit paths interleaved with a number of latches. For example, circuit path 1731 includes sub-circuit paths 1741 interleaved with latches 1751. Other circuit paths 1732, 1733, and 1734 include sub-circuit paths 1742, 1743, and 1744, respectively. Sub-circuit paths 1742, 1743, and 1744 interleave with latches 1752, 1753, and 1754, respectively.

Each of the sub-circuit paths includes a number of drive units represented by inverters. For example, sub-circuit path 1741 includes a number of drive units 1761. Other sub-circuit paths 1742, 1743, and 1734 include drive units 1762, 1763, and 1764 respectively. Each of the sub-circuit paths 1741-1744 of FIG. 12 may include embodiments of circuit paths described above in FIG. 1 through FIG. 11.

In FIG. 12, latches 1751-1754 receive a clock signal CLK to adjust the timing of the signals transferred in interconnect structure 1730. In some cases, the signals transferred on interconnect structure 1730 have relative timing relationships among each other. The relative timing relationships may be adjusted after propagating for some distance in the circuit paths 1741-1744. Latches 1751-1754 allow interconnect structure 1730 to adjust the relative timing relationships among signals propagating in circuit paths 1741-1744.

Figure 13:
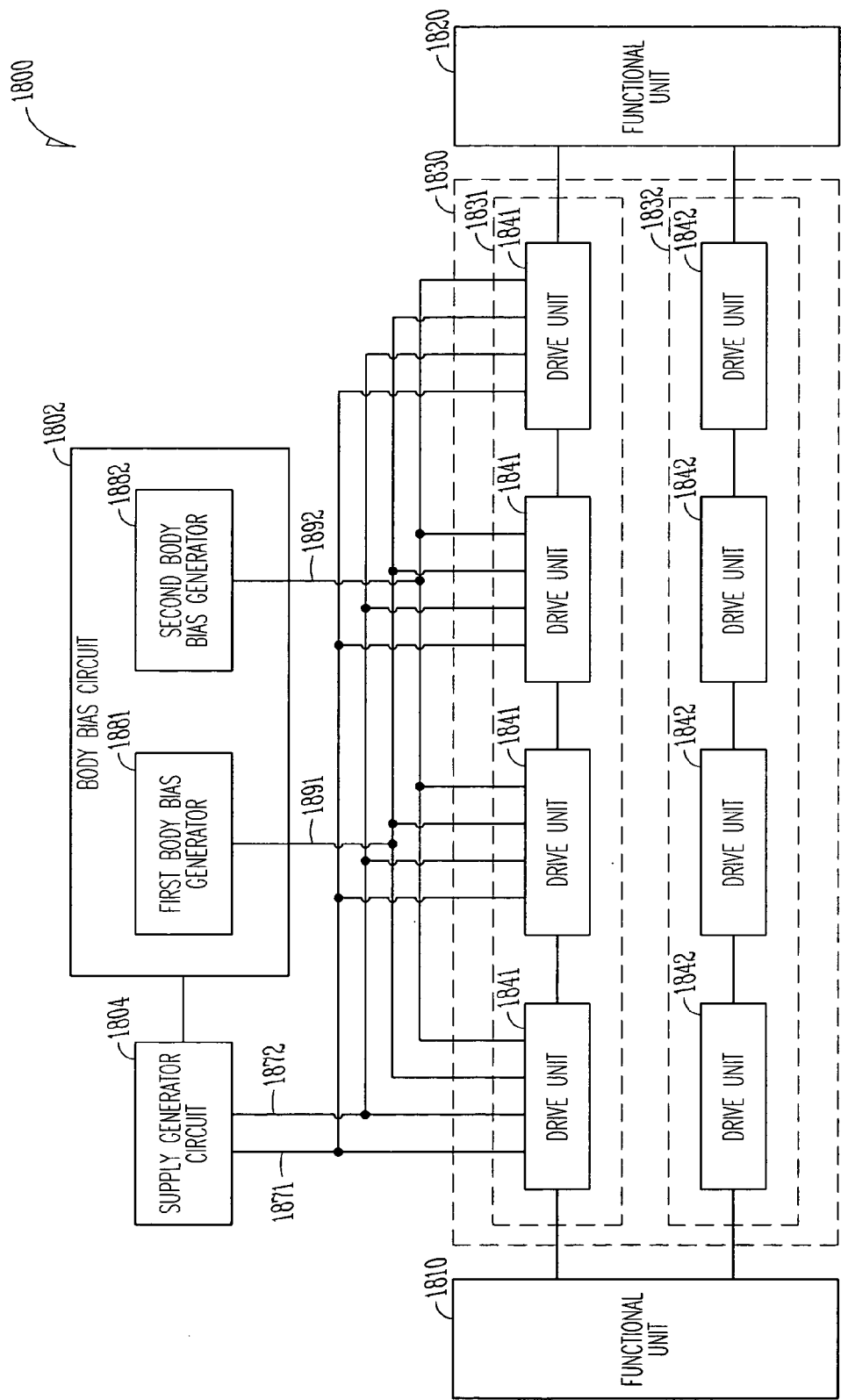
FIG. 13 shows a device with various generator circuit and an interconnect structure according to embodiments of the invention.

FIG. 13 shows a device with various generator circuits and an interconnect structure according to embodiments of the invention. Device 1800 includes a bias generator circuit 1802, a supply generator circuit 1804, functional units 1810 and 1820, and an interconnect structure 1830.

Supply generator circuit 1804 includes a supply node 1871 to provide a supply voltage Vcc and a supply node 1872 to provide a supply voltage Vss.

Bias generator circuit 1802 includes first and second bias generators 1881 and 1882. Bias generator 1881 includes a bias node 1891 to provide the bias voltage $V_{BBP}$. Bias generator 1882 includes a bias node 1892 to provide the bias voltage $V_{BBN}$. In some embodiments, Vcc is greater than each of the bias voltages $V_{BBP}$ and $V_{BBN}$. In some embodiments, Vss is ground.

Interconnect structure 1830 includes circuit paths 1831 and 1832. Circuit path 1831 has drive units 1841. Circuit path 1832 has drive units 1842. Each of the circuit paths 1841 connects to supply nodes 1871 and 1872 to receive supply voltages Vcc and Vss. Each of the circuit paths 1841 also connects to bias nodes 1891 and 1892 to receive bias voltages $V_{BBP}$ and $V_{BBN}$. In some embodiments, some of drive units are disconnected from bias generator circuit 1802.

FIG. 13 shows only two circuit paths, however, the number of circuit paths may be different from two.

Figure 14:
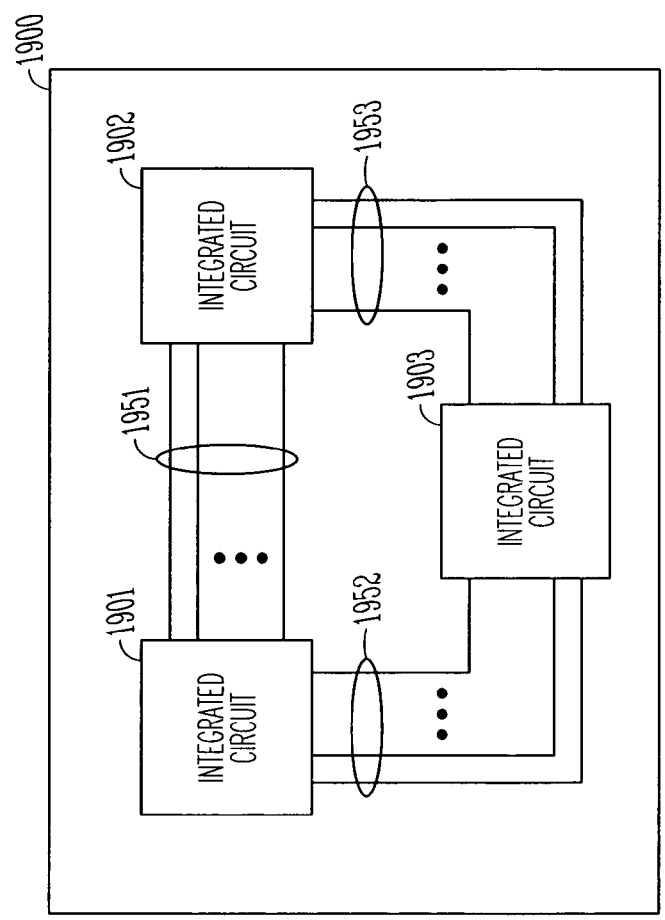
FIG. 14 shows a single chip having multiple devices and multiple interconnect structures according to embodiments of the invention.

FIG. 14 shows a single chip having multiple devices and multiple interconnect structures according to embodiments of the invention. Chip 1900 includes integrated circuits 1901, 1902, and 1903. Each of the integrated circuits 1901, 1902, and 1903 may be a processing unit, a memory controller, a memory device, or other types of integrated circuits. In some embodiments, chip 1900 may include multiple processors presented by at least two of the integrated circuits 1901, 1902, and 1903. Each of the integrated circuits 1901, 1902, and 1903 may include one or more of the devices described in FIG. 1 through FIG. 13 above.

Chip 1900 also includes interconnect structures 1951, 1952, and 1953. Each of the interconnect structures 1951, 1952, and 1953 may include any combination of the interconnect structures described in FIG. 1 through FIG. 13. For clarity, FIG. 14 shows interconnect structures 1951, 1952, and 1953 as lines. However, the lines of interconnect structures 1951, 1952, and 1953 may represent circuit paths such as any one of the circuit paths described in FIG. 1 through FIG. 13.

Each of the interconnect structures 1951, 1952, and 1953 serves as an on-chip bus to transfer data among integrated circuits 1901, 1902, and 1903.

Figure 15:
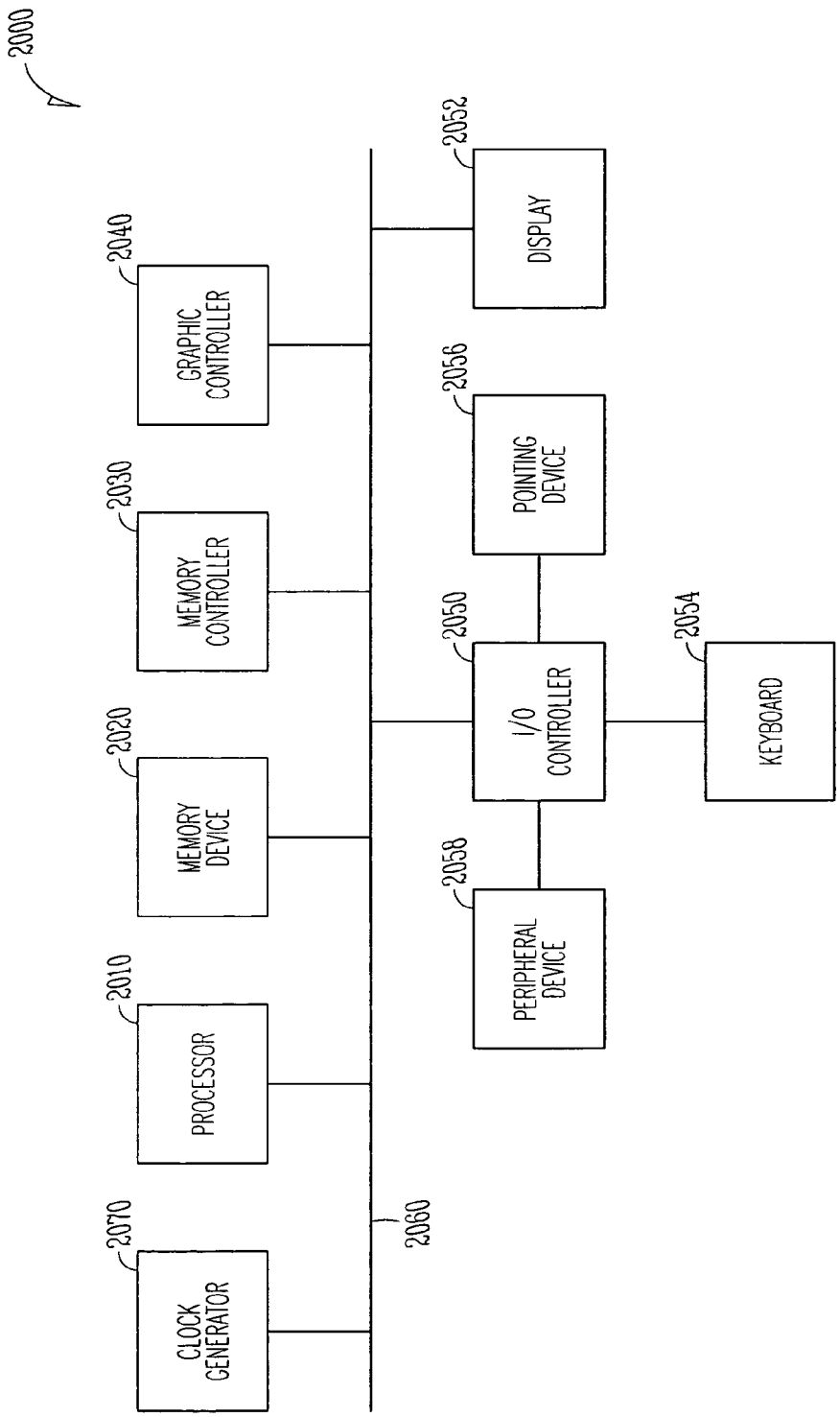
FIG. 15 shows a system according to embodiments of the invention.

FIG. 15 shows a system according to embodiments of the invention. System 2000 includes a processor 2010, a memory device 2020, a memory controller 2030, a graphic controller 2040, an input and output (I/O) controller 2050, a display 2052, a keyboard 2054, a pointing device 2056, and a peripheral device 2058. A bus 2060 connects all of these devices together. A clock generator 2070 provides an external clock signal to at least one of the devices of system 2000. In some embodiments, system 2000 may omit one or more devices shown in FIG. 15.

Bus 2060 may be conducting traces on a circuit board or may be one or more cables. Bus 2060 may also connect the devices of system 2000 by wireless means such as electromagnetic radiation (e.g., radio waves). Peripheral device 2058 may be a printer, an optical device (e.g., a CD-ROM device or a DVD device), a magnetic device (e.g., floppy disk driver), or an audio device (e.g., a microphone). Memory device 2020 may be a dynamic random access memory (DRAM) device, a static random access memory (SRAM) device, or may be a flash memory device, or a combination thereof.

At least one of the devices shown in system 2000 includes embodiments of the devices described in FIG. 1 through FIG. 14. Thus, at least one of the devices shown in system 2000 includes embodiments of the interconnect structures described in FIG. 1 through FIG. 14 in which the interconnect structures serve as one or more on-chip buses to transfer data within the device. For example, processor 2010 may include embodiments of interconnect structures described in FIG. 1 through FIG. 14 to transfer data within processor 2010.

In some embodiments, two or more devices shown in system 2000 may be formed in a single chip in which the single chip may include embodiments of the interconnect structures described in FIG. 1 through FIG. 14 to serve as an on-chip bus to transfer data among the devices on the single chip.

System 2000 of FIG. 15 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

Figure 16:
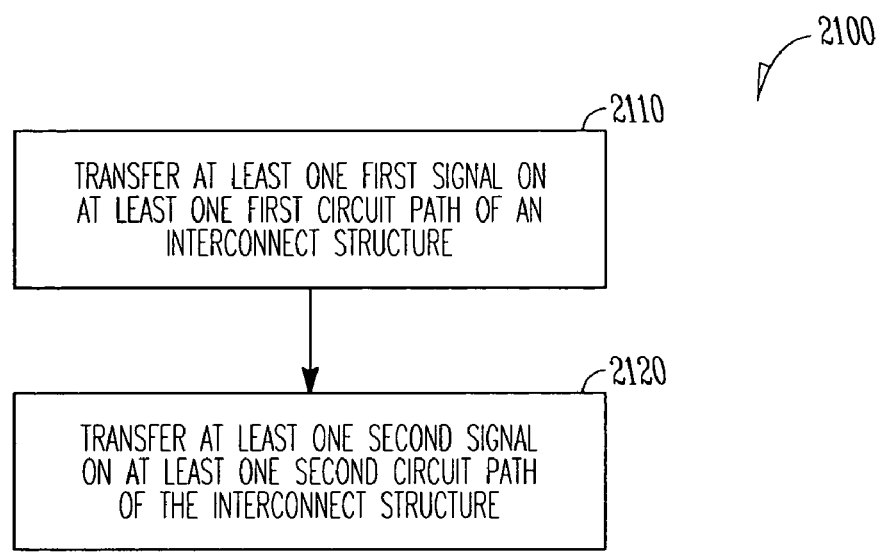
FIG. 16 is a flowchart of a method of transferring signal on an interconnect structure according to embodiments of the invention.

FIG. 16 is a flowchart of a method of transferring data via an interconnect structure. Method 2100 transfers at least two signals via the interconnect structure connected between at least two functional units. In some embodiments, the signals are differential signals.

Box 2110 transfers at least one first signal on at least one first circuit path. The first signal represents a first data.

Box 2120 transfers at least one second signal on at least one second circuit path. The second signal represents a second data. In some embodiments, the first signal is an inversion of the second signal such that, at the start of the transfer, the first signal switches from a first signal level to a second signal level and the second signal switches from the second signal level to the first signal level.

The first and second circuit paths are part of an interconnect structure connected between two or more functional units. The interconnect structure represents a bus to transfer data between the functional units.

In some embodiments, the interconnect structure represents an on-chip bus in which the functional units are located in the same integrated circuit in a chip. In other embodiments, the interconnect structure represents an on-chip bus in which the functional units are located in different integrated circuits of the same (single) chip. For example, the first functional unit may be located in a first integrated circuit of the chip and the second functional unit may be located in a second integrated circuit of the same chip.

In some embodiments, the interconnect structure in method 2100 includes embodiments of any one of the interconnect structures described in FIG. 1 through FIG. 15.

In the description of FIG. 1 through FIG. 16, the devices, or portions and features of the interconnect structures in some embodiments may be included in or substituted for those of the other embodiments.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A device comprising:
  a functional unit;
  a plurality of circuit paths including a first circuit path and
    a second circuit path coupled to the functional unit; and a plurality of additional circuit paths including a third circuit pat and a fourth circuit path coupled to the functional unit and interleaved with the plurality of circuit paths such that the third circuit path is between the first and second circuit paths and the second circuit path is between the third and fourth circuit paths, each of the first and second circuit paths including a number of first drive units, each of the first drive units including an input node, an output node, a first transistor and a second transistor coupled to the input and output nodes, the first transistor of each of the first drive units including a source region coupled to a first supply node and a body region coupled to a first bias node, the second transistor of each of the first drive units including a source region coupled to a second supply node and a body region coupled to a second bias node, wherein each of the third and fourth circuit paths includes a number of second drive units, each of the second drive units including third transistor and a fourth transistor, the third transistor of each of the second drive units including a source region coupled to the first supply node and a body region coupled to the first supply node, the fourth transistor of each of the second drive units including a source region coupled to the second supply node and a body region coupled to the second supply node.

2. The device of claim 1, wherein the first and second circuit paths have an equal number of circuit elements.

3. The device of claim 2, wherein the first and second transistors in each of the first drive units form an inverter.

4. The device of claim 3 further comprising at least one latch coupled between two of the first drive units.

5. The device of claim 1, wherein the first transistor of each of the first drive units has a threshold voltage unequal to a threshold voltage of the third transistor of each of the second drive units, and wherein the second transistor of each of the first drive units has a threshold voltage unequal to a threshold voltage of the fourth transistor of each of the second drive units.

6. The device of claim 5, wherein the first transistor of each of the first drive units and the third transistor of each of the second drive units have an equal transistor channel width and an equal transistor channel length, and wherein the second transistor of each of the first drive units and the fourth transistor of each of the second drive units have an equal transistor channel width and an equal transistor channel length.

7. The device of claim 6, wherein each of the first and second circuit paths and each of the third and fourth circuit paths includes matched drive units.

8. A device comprising:
a functional unit;
a plurality of circuit paths including a first circuit path and a second circuit path coupled to the functional unit; and
a plurality of circuit paths including a third circuit path and a fourth circuit path coupled to the functional unit and interleaved with the plurality of circuit paths such that the third circuit path is between the first and second circuit paths and the second circuit path is between the third and fourth circuit paths, each of the first and second circuit paths including a number of drive units with a first drive unit having an output node coupled to an input node of a first additional drive unit, each of the third and fourth circuit paths including a number of drive units with a second drive unit and a second additional drive unit, the first drive unit including a first transistor having a source region coupled to a first supply node and a body region coupled to a first bias node, and a second transistor having a source region coupled to a second supply node and a body region coupled to the second supply node, the first additional drive unit including a first additional transistor having a source region coupled to the first supply node and a body region coupled to the first supply node, and a second transistor having a source region coupled to the second supply node and a body region coupled to a second bias node.

9. The device of claim 8, wherein the second drive unit include an output node coupled to an input node of the second additional drive unit, the second drive unit including a first transistor having a source region coupled to the first supply node and a body region coupled to the first bias node, and a second transistor having a source region coupled to the second supply node and a body region coupled to the second supply node, the second additional drive unit including a first additional transistor having a source region coupled to the first supply node and a body region coupled to the first supply node, and a second transistor having a source region coupled to the second supply node and a body region coupled to a second bias node.

10. The device of claim 9, wherein the number of drive units of each of the first and second circuit paths includes a further drive unit having an input node coupled to an output node of the first additional drive unit, the further unit drive including a first transistor having a source region coupled to the first supply node and a body region coupled to the first bias node, and a second transistor having a source region coupled to the second supply node and a body region coupled to the second supply node.

11. The device of claim 10 further comprising at least one latch coupled between two of the drive units of one of the first and second circuit paths, and at least one latch coupled between two of the drive units of one of the third and fourth circuit paths.

12. The device of claim 8, wherein each of the first and second circuit paths and each of the third and fourth circuit paths include identical drive units.

13. The device of claim 8, wherein each of the first and second circuit paths and each of the third and fourth circuit paths have an equal number of circuit elements.

14. A device comprising:
a functional unit;
a plurality of circuit paths including a first circuit path and a second circuit path coupled to the functional unit; and
a plurality of additional circuit paths including a third circuit path and a fourth circuit path coupled to the functional unit and interleaved with the plurality of circuit paths such that the third circuit path is between the first and second circuit paths and the second circuit path is between the third and fourth circuit paths, each of the first and second circuit paths including a number of drive units with a first drive unit having an output node coupled to an input node of a first additional drive unit, each of the third and fourth circuit paths including a number of drive units with a second drive unit and a second additional drive unit, the first drive unit including a first transistor of a first transistor type and a second transistor of a second transistor type, the first transistor having a threshold voltage lower than a threshold voltage the second transistor, the first additional drive unit including a third transistor of the first transistor type and a fourth transistor of the second transistor type, the third transistor having threshold voltage greater than a threshold voltage the fourth transistor.

15. The device of claim 14, wherein the fourth transistor includes a source region coupled to a supply node and a body region coupled to a bias node.

16. The device of claim 14, wherein the first transistor includes a source region coupled to a supply node and a body region coupled to a bias node.

17. The device of claim 16, wherein the the number of drive units of each of the first and second circuit paths includes a further drive unit having an input node coupled to an output node of the first additional drive unit, the further unit drive including a fifth transistor of the first transistor type and a sixth transistor of the second transistor type, the fifth transistor having a threshold voltage lower than a threshold voltage the sixth transistor.

18. The device of claim 17 further comprising at least one latch coupled between two of the drive units of one of the first and second circuit paths, and at least one latch coupled between two of the drive units of one of the third and fourth circuit paths.

19. The device of claim 14, wherein each of the first and second circuit paths and each of the third and fourth circuit paths include drive units having matched constructions.

20. The device of claim 19, wherein each of the first and second circuit paths and each of the third and fourth circuit paths have an equal number of circuit elements.

21. A system comprising;
a first integrated circuit;
a second integrated circuit; and
an interconnect structure coupled between the first and second integrated circuits, the interconnect structure including:
a plurality of first circuit paths including a first circuit path and a second circuit path coupled to the functional unit; and
a plurality of additional circuit paths including a third circuit path and a fourth circuit path interleaved with the plurality of first circuit paths such that the third circuit path is between the first and second circuit paths and the second circuit path is between the third and fourth circuit paths, the first transistor of each of the first drive units including a source region coupled to a first supply node and a body region coupled to a first bias node, the second transistor of each of the first drive units including a source region coupled to a second supply node and a body region coupled to a second bias node, wherein each of the third and fourth circuit paths includes a number of second drive units, each of the second chive units including third transistor and a fourth transistor, the third transistor of each of the second drive units including a source region coupled to the first supply node and a body region coupled to the first supply node, the fourth transistor of each of the second drive units including a source region coupled to the second supply node and a body region coupled to the second supply node.

22. The system of claim 21, wherein the first and second circuit paths have an equal number of circuit elements.

23. The system of claim 22 further comprising a number of first latches, and a number of second latches, wherein at least two of the first latches are coupled in one of the first and second circuit paths, and wherein at least two of the second latches are coupled in one of the third and fourth circuit paths.

24. The system of claim 21, wherein the first transistor of each of the first drive units has a threshold voltage unequal to a threshold voltage of the third transistor of each of the second drive units, and wherein the second transistor of each of the first drive units has a threshold voltage unequal to a threshold voltage of the fourth transistor of each of the second drive units.

25. The system of claim 24, wherein the first and second integrated circuits are formed in a single chip.

* * * * *

UNITED STATES PATENT AND TRADEMARK OFFICE
CERTIFICATE OF CORRECTION

PATENT NO. : 7,326,972 B2 Page 1 of 1
APPLICATION NO. : 10/880988
DATED : February 5, 2008
INVENTOR(S) : Ghoneima et al.

It is certified that error appears in the above-identified patent and that said Letters Patent is hereby corrected as shown below:

In column 11, line 2, in Claim 1, delete "pat" and insert -- path --, therefor.

In column 13, line 29, in Claim 21, after "comprising" delete ";" and insert -- : --, therefor.

In column 14, line 12, in Claim 21, delete "chive" and insert -- drive --, therefor.

Signed and Sealed this

Twenty-fifth Day of November, 2008

JON W. DUDAS
*Director of the United States Patent and Trademark Office*